United States Patent [19]
Kalpakjian et al.

[11] Patent Number: 5,677,555
[45] Date of Patent: Oct. 14, 1997

[54] OUTPUT DRIVER TRANSISTOR WITH MULTIPLE GATE BODIES

[75] Inventors: Kent M. Kalpakjian; Cathal G. Phelan, both of Mountain View, Calif.

[73] Assignee: Cypress Semiconductor Corp., San Jose, Calif.

[21] Appl. No.: 577,480

[22] Filed: Dec. 22, 1995

[51] Int. Cl.$^6$ ................................................ H01L 29/78
[52] U.S. Cl. .................... 257/206; 257/401; 257/208; 327/399; 327/566
[58] Field of Search ............................ 257/401, 208, 257/206; 327/399, 566

[56] References Cited

U.S. PATENT DOCUMENTS

| | | | |
|---|---|---|---|
| 4,516,312 | 5/1985 | Tomita | 257/206 |
| 5,229,667 | 7/1993 | Shimizu | 257/369 |
| 5,563,439 | 10/1996 | Chung et al. | 257/401 |

*Primary Examiner*—Tom Thomas
*Assistant Examiner*—David B. Hardy
*Attorney, Agent, or Firm*—Blakely, Sokoloff, Taylor & Zafman, LLP

[57] ABSTRACT

Method and apparatus for controlling an output transistor in an output driver circuit. In one embodiment of the invention, an input signal is routed to a first gate body which is disposed over a first channel region in a substrate. The first gate body has a first resistance to the input signal and delays the input signal through the first gate body to provide a delayed input signal. This delayed input signal is routed to a second gate body which is disposed over a second channel region in the substrate. The first gate body is coupled to the second gate body to provide the delayed input signal to the second gate body. According to one embodiment of the invention, the transistor includes the first gate body coupled to an input signal and coupled to the second gate body to receive the input signal through the first resistance of the first gate body. The first gate body produces a field in the first channel region in response to the input signal before the second gate body produces a field in the second channel region.

13 Claims, 6 Drawing Sheets

OUTPUT DRIVER TRANSISTOR WITH MULTIPLE GATE BODIES

FIELD OF THE INVENTION

The present invention relates to methods and apparatuses for controlling a transistor in an output driver or in other circuits.

BACKGROUND OF THE INVENTION

Output driver circuits in modern integrated circuits (ICs) typically generate noise when the output stage transistors drive the output load from one state to another state through the package's inductance. When a larger current is quickly passed through a package inductor, a voltage develops across the inductor according to the equation V=L(dI/dT), which translates to a larger voltage spike on the VCC and VSS power supplies. This spike in turn feeds back into other circuits, causing a delay in the circuits' operations or in some cases a glitch causing a false operation, such as a false address access.

An example of an output driver circuit with the foregoing problem is typically found in a modern static random access memory (SRAM) IC. FIG. 1a shows a typical implementation of an output driver transistor which is coupled to receive an input signal 14 from a buffer 12, which is itself driven by a turn on signal 10. This prior art transistor is an insulated gate field effect transistor, typically fabricated in MOS technology. The transistor includes a polysilicon gate having a plurality of legs 16a through 16l and an interconnect 15, which is typically formed, in one embodiment, as a silicided polysilicon body which couples together the polysilicon gates 16a through 16l. These gates are disposed over corresponding channel regions which separate source and drain regions as shown in FIGS. 1a and 1c. It will be appreciated that region 17 is a diffusion region in a semiconductor substrate and is typically surrounded by an isolation region, such as a field oxide 21 shown in the cross sectional view of FIG. 1c. The gate legs, such as gate leg 16a, are disposed over the diffusion region and partially over the isolation region. FIG. 1b shows the source and drain interconnects to the source and drain regions in the region 17. It will be appreciated that, as shown in FIG. 1b, the interconnect to the source regions makes contact to the source regions 17a, 17c, and 17e. It will be appreciated that the source interconnect 20 is not in electrical contact with the gate bodies or legs 16a, 16b, 16c, 16d, and 16e and not in contact with the silicided polysilicon body 15; rather, the portions of the interconnects 20a and 20b overlap without touching the gate interconnect 15. The drain interconnect 19 makes contact with drain regions 17b, 17d and 17f in order to form an electrical connection between the drain interconnect 19 and these drain regions. It will be appreciated that a turn on signal 10 applied through buffer 12 causes an input signal 14 to generate a field in the channel region underlying the insulated gates 16a, 16b, 16c, 16d and 16e thereby causing current to flow between the source and drain regions. This current causes the output driver to switch the state of the output pad or interconnect to which it is connected.

FIG. 1c shows a partial cross sectional view of the transistor shown in FIG. 1a. It can be seen that the channel regions are disposed under the insulated gates, such as insulated gates 16a, 16b, 16c, and 16d and that there are source and drain regions disposed in the semiconductor substrate 22. It will be appreciated that a field isolation region, such as a field oxide 21 surrounds the entire rectangle of the diffusion region 17.

The output driver transistor shown in FIG. 1a is susceptible to creating noise on the integrated circuit which includes this output transistor. This noise is created in the manner described above when a large current is quickly passed through the transistor in order to drive the output load from one state to another through the inductance of the package containing the IC. Thus, it is desirable to suppress the on-chip noise generated by the output drivers, and FIG. 2 shows a prior solution to suppress on chip noise by reducing the change in current over time when the output driver changes from one state to another.

As shown in FIG. 2, there are four groups of gate legs or gate bodies, each of which is connected together by a silicided polysilicon interconnect, such as interconnects 25, 26, 27, or 28. The first group of gate bodies or legs includes the gate bodies or legs 25a, 25b, and 25c which are coupled together by an interconnect 25 which receives an input signal 14a from the buffer 12. Similarly, a second group of gate bodies 26a, 26b and 26c, having the same number of gate bodies as the first group, is also disposed over the diffusion region 17 which contains source and drain regions as well as the channel regions which correspond to the gate bodies. The gate bodies 26a, 26b, and 26c are coupled together by the interconnect 26 which receives an input signal 14b which has been delayed relative to the signal 14a by delay box 29, which may typically be a series of inverters designed to delay the input signal. Similarly, a third group of gate bodies 27a, 27b, and 27c is coupled together by an interconnect 27 which receives a further delayed input signal 14c, which has been delayed by two delay boxes 30a and 30b. Finally, a fourth group of gate bodies 28a, 28b, and 28c are coupled together by the interconnect 28 which receives an input signal 14d which has been delayed three times relative to the original signal 14a by the three delay boxes 31a, 31b, and 31c. When the turn on signal is applied to the buffer 12 this generates the input signal 14a which causes the gate bodies 25a, 25b, and 25c to create a field in the channel region immediately below the corresponding gate body, which then causes current to flow between the corresponding source and drain regions in the diffusion region 17. This is the initial stage of operation of this output transistor such that only a portion of the channel regions in the diffusion region 17 are conducting current. As the delay boxes generate the delayed signals 14b, 14c, and 14d, more channel regions "turn on" causing more current to flow. Thus, the delay boxes tend to reduce the change in current (I) over time (T) thereby reducing the noise generated because dI/dT is reduced.

It will be appreciated that the prior art implementation shown in FIG. 2 requires additional circuitry, such as the delay boxes in order to generate the delayed signals which drive the different groups of gates. These additional circuits take up additional space on the integrated circuit and further consume additional power; thus, while the circuit of FIG. 2 has certain advantages, it also has several disadvantages.

SUMMARY OF THE INVENTION

An apparatus and method is described for controlling a transistor in an output driver circuit. According to a method of the present invention, an input signal is routed to a first gate body which is disposed over a first channel region in the substrate. The first gate body has a first resistance to the input signal and delays the input signal as it routes or propagates through the first gate body. The delayed input signal is routed through the first gate body to a second gate body which is disposed over a second channel region in the substrate. The first gate body is coupled to the second gate body to provide the delayed input signal to the second gate body. In this manner, the parasitic resistance of the gate, typically fabricated using polysilicon, is used to control the "turn on" (e.g. when the gate body creates a field in the channel region) of the output driver gate. Consequently, the first gate body produces a field in a corresponding first channel region before the second gate body produces a field in a second corresponding channel region.

According to another embodiment of the present invention, a transistor comprises a first plurality of gate bodies over a corresponding first plurality of channel regions in a substrate, where the first plurality of gate bodies includes a first gate body. The transistor further comprises a second plurality of gate bodies over a corresponding second plurality of channel regions in the substrate. The second plurality of gate bodies has more gate bodies than the first plurality of gate bodies and includes a second gate body which is coupled to the first gate body. The first plurality of gate bodies produces a field in the first plurality of channel regions before the second plurality of gate bodies produces a field in the second plurality of channel regions. In this manner, the turn on of output driver gates is staggered from a first group of gates to a second larger group of gates. In one embodiment, the gate bodies are connected in such a way so that the first few legs of the gate turn on slowly (through a high resistance) in order to limit dI/dT, but then subsequent gate bodies are turned on more quickly (through a low resistance) in order to maintain the speed of the gate. Typically, the second plurality of gates is connected to the input signals through at least one of the gate bodies in the first plurality of gate bodies rather than through a separate circuit interconnect.

According to one embodiment of an apparatus of the present invention, a transistor includes a first gate body which is coupled to an input signal, where this first gate body is disposed over a corresponding first channel region in a substrate. The first gate body provides a first resistance to the input signal and is coupled to a second gate body which receives the input signal from the first gate body through the first resistance. The second gate body is disposed over a corresponding second channel region in the substrate. The first gate body produces a field in the first channel region in response to the input signal before the second gate body produces a field in the second channel region.

BRIEF DESCRIPTION OF THE DRAWINGS

FIG. 1c shows a cross sectional view of a portion of FIG. 1a.

DETAILED DESCRIPTION

The following description sets fourth numerous specific details in order to provide a thorough understanding of the preset invention. However, after reviewing the specification, it will be understood by those skilled in the art that the present invention may be practiced without these specific details. For example, various gate layouts, gate interconnects and geometry's and other details may be modified according to the present invention. In other instances, well known structures and circuits have not been described in order to not unnecessarily obscure the present invention.

Figure 3:
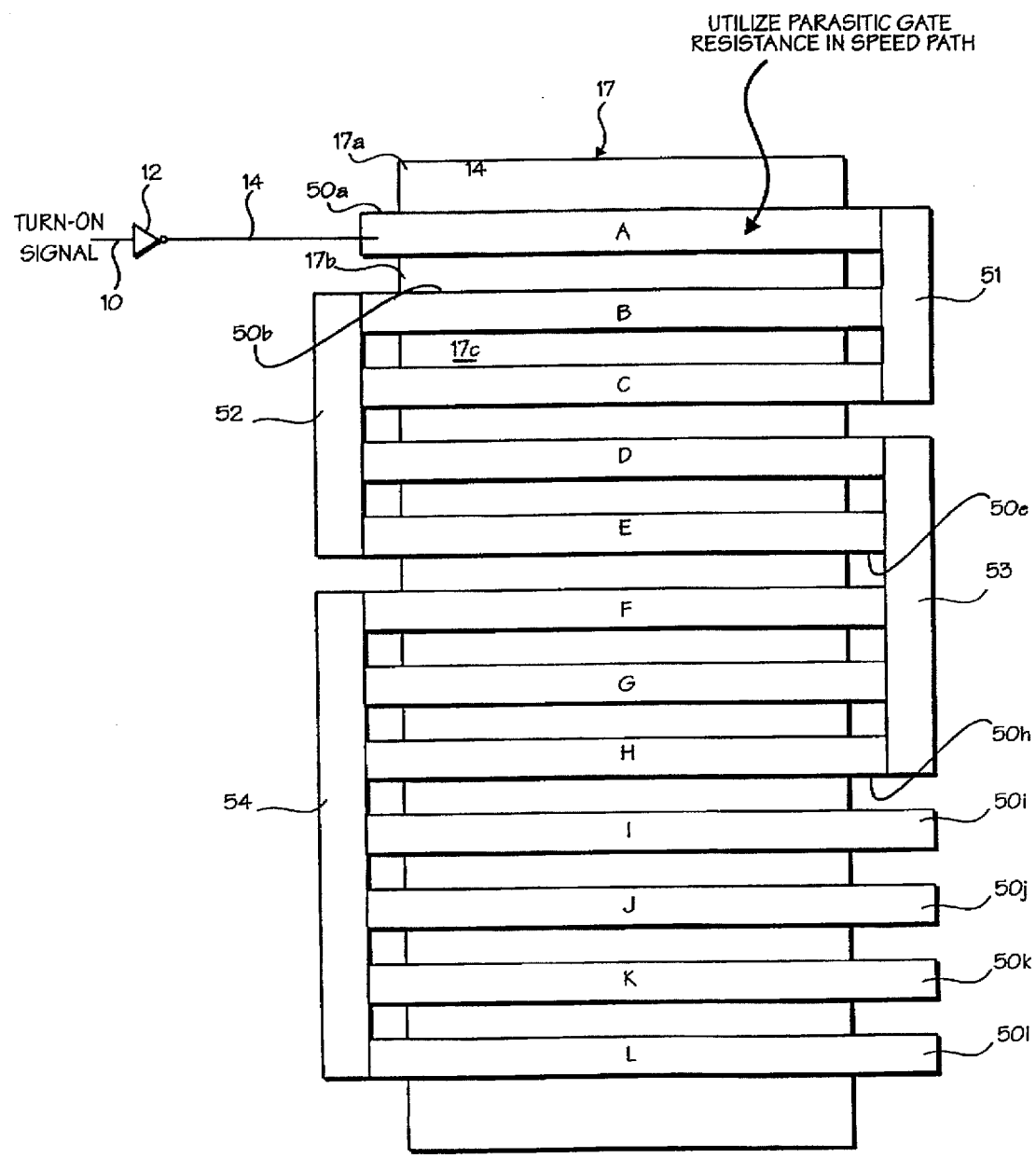
FIG. 3 shows an embodiment of an output transistor according to the present invention.

FIG. 3 shows an output transistor according to the present invention. The structure of this transistor will be described first, followed by a discussion of its operation. It will be appreciated that the transistor shown in FIG. 3 includes the diffusion region 17 having a plurality of source and drain regions, such as source regions 17a and 17c as well as drain regions 17b and 17d. As with the prior art transistor, a field isolation region typically surrounds the entire diffusion region, and a channel region is disposed in the substrate under each insulated gate body member (also referred to as a gate leg). The transistor includes a plurality of gate legs 50a through 50l. The transistor of FIG. 3 may be considered to have five groups of gate legs which are interconnected by the gate interconnect bodies 51, 52, 53 and 54. It will be appreciated that the gate interconnects 51 through 54 are typically formed, in one embodiment, from silicided polysilicon body members which are disposed over the field isolation regions in order to interconnect the gate legs or gate bodies without creating any substantial fields over the diffusion region 17. The gate bodies over the channel regions in the diffusion region 17 are typically formed, in this embodiment, from polysilicon. In other embodiments, unsilicided polysilicon may be employed in both the gate bodies over the diffusion region and in the gate interconnects between the gate bodies. In other further embodiments, the gate interconnect may be formed from metal and the gate bodies may be other materials used for insulated gates (e.g. silicided polysilicon). It will be appreciated that silicided polysilicon has a lower resistance than unsilicided polysilicon.

The five groups or pluralities of gate bodies include a first gate body 50a which is the only gate body in the first group. The second group of gate bodies includes gate bodies 50b and 50c which are coupled together by the gate interconnect 51. Note that an input signal may propagate in parallel through gate bodies 50b through 50c from the interconnect 51 to the interconnect 52. The third group of gate bodies is made up of gate body 50d and gate body 50e which are coupled to gate bodies 50b and 50c through interconnect 52.

The third group of gate bodies is gate bodies 50f, 50g and 50h which are coupled together by the interconnect 53 and are also coupled to the gate bodies 50d and 50e. This fourth group of gate bodies is coupled to the third group via the interconnect 53. Lastly, the fifth group of gate bodies includes gate bodies 50i, 50j, 50k and 50l which are interconnected together by gate interconnect 54. This gate interconnect 54 connects this fifth group of gate bodies to the fourth group of gate bodies. It can be seen from FIG. 3 that the number of gate bodies in each group either stays the same or increases which each succeeding group of gate bodies. For example, the first group of gates has only one gate body while the second group of gates has two. Also note that the input signal must propagate through gate body 50a before it reaches gate bodies 50b and 50c via the interconnect 51.

Figure 1A:
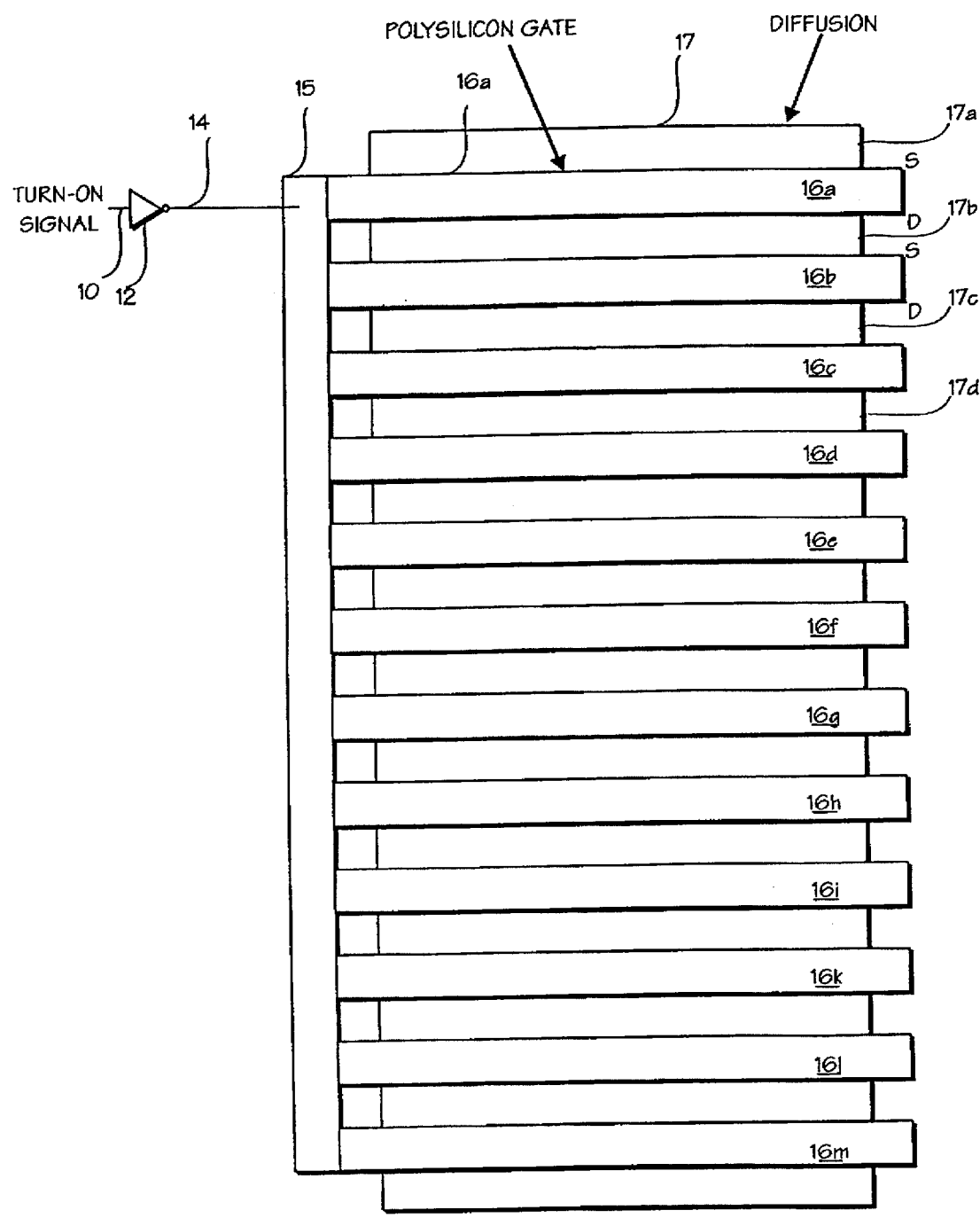
FIG. 1a shows an output driver transistor in the prior art.
Figure 1B:
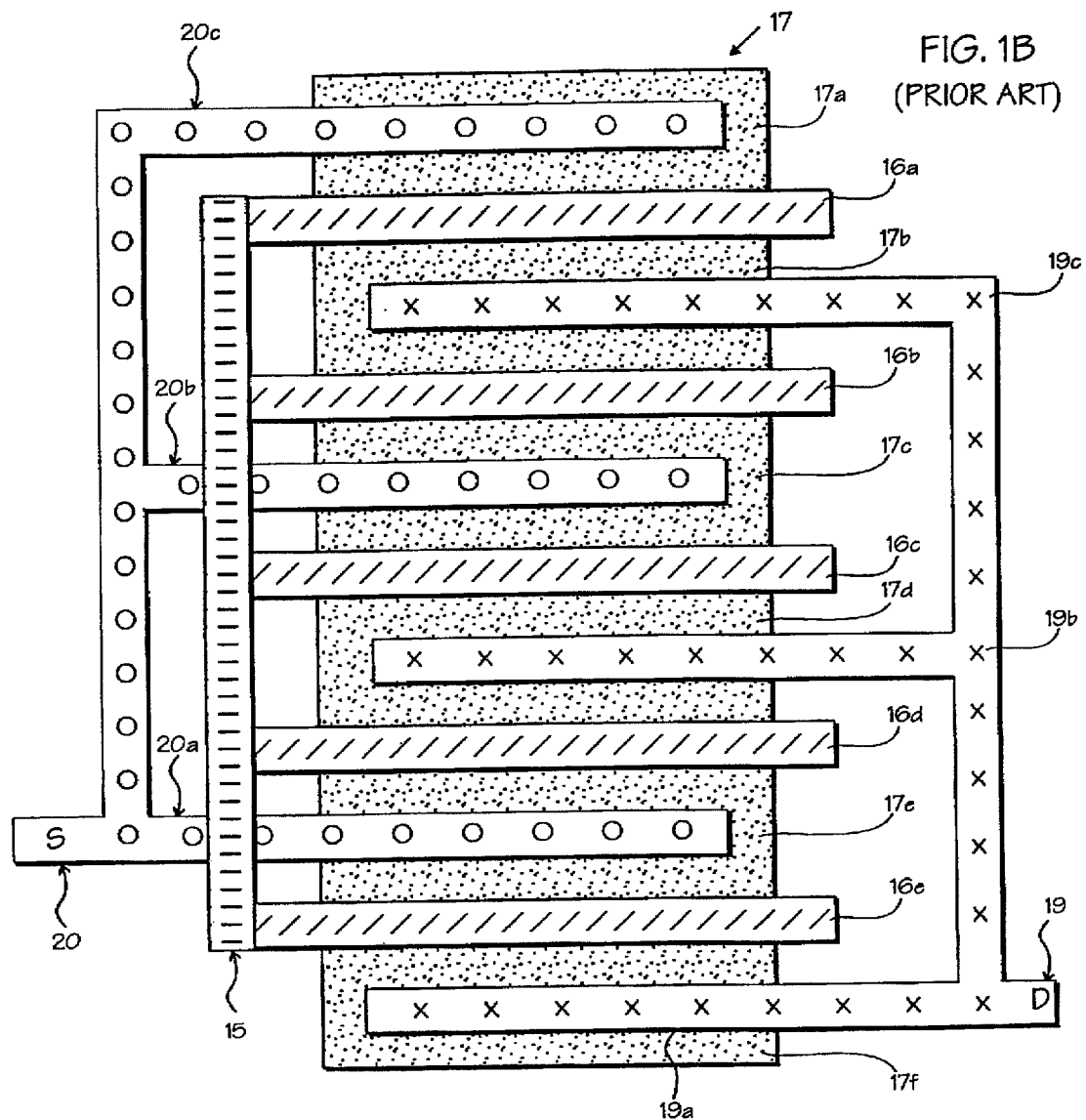
FIG. 1b shows an output driver transistor in the prior art with source and drain interconnects also illustrated.
Figure 1C:
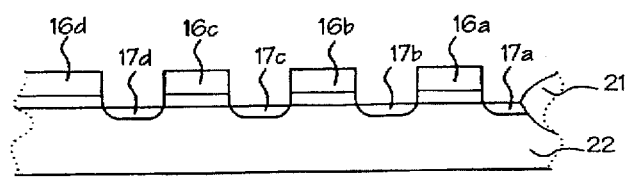

It will be appreciated that the transistor shown in FIG. 3 will conduct less current initially than when all gate legs are creating a field in the corresponding channel region. In this manner, the rate of change of current for this transistor is smaller than the rate of change of current for the transistor shown in FIG. 1a. Moreover, the transistor shown in FIG. 3 produces a similar result, in terms of rate of change of current, as the transistor shown in FIG. 2 without the additional circuitry required by the implementation shown in FIG. 2.

The operation of the transistor shown in FIG. 3 will now be described. The input signal 14 initially only turns on the first gate leg 50a quickly, thereby limiting the amount of current initial flowing through this transistor. Next, gate bodies 50b and 50c are turned on after a finite amount of time due to the parasitic resistance of gate body 50a. Now with an additional two gate bodies on, the device conducts a bit more current because of the fields generated in the channel regions below gate bodies 50b and 50c (in addition to the field generated in the channel region below the gate body 50a). Next, gate bodies 50d and 50e are turned on after receiving a further delayed input signal through interconnect 52. This further delay is due to the parallel resistance of gate bodies 50b and 50c. After a further finite amount of time gate legs 50f, 50g, and 50h are turned on through the parallel resistance of gate legs 50d and 50e. That is, after this further finite amount of time, three additional channel regions are conducting in addition to the prior five channel regions associated with gates 50a through 50e. Finally, gate bodies 50i through 50l are turned on through the parallel resistance of gate bodies 50f, 50g, and 50h. At this point, all channel regions associated with all gate bodies are conducting, which means that the transistors is conducting maximum current, which only occurs at the end of this process rather than in the beginning.

Figure 4:
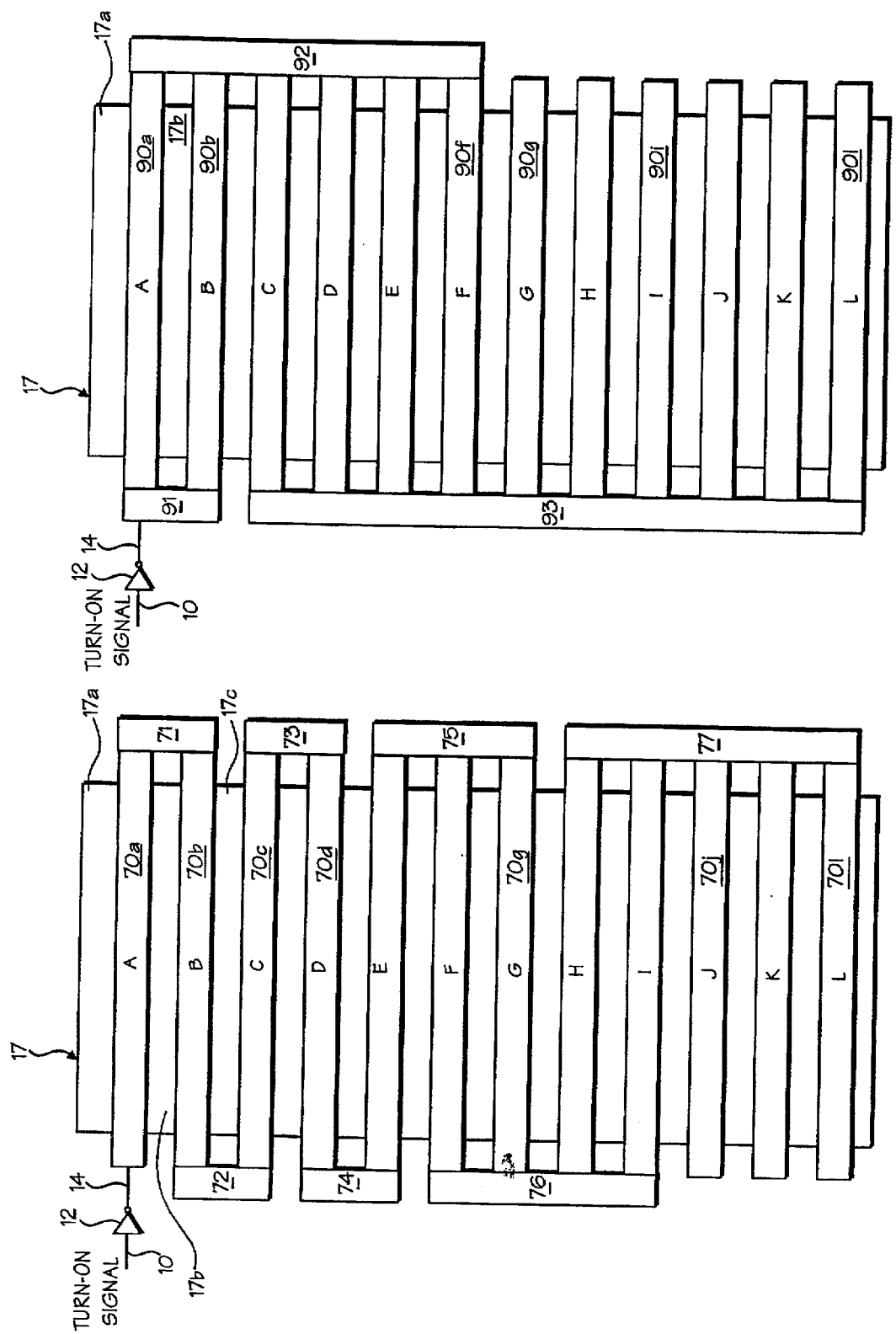
FIG. 4a shows another embodiment of an output transistor according to the present invention.
FIG. 4b shows another embodiment of an output transistor according to the present invention.

FIGS. 4a and 4b show two alternative embodiments of the present invention. These figures demonstrate that the gate configuration of the output driver transistor of the present invention may be modified in order to produce various results which are desired by the circuit designer. It will be appreciated that choosing the optimum resistor sequence (that is, the sequence of parasitic gate resistance) may lead to a reduced noise with minimum loss in access time or performance time in terms of speed. FIG. 4a shows a transistor having a slower "turn on" performance but having better noise control. That is, this transistor will provide slower output transition from one state to anther but will provide better noise control. The output transistor shown in FIG. 4a includes eight groups of gate bodies. The first five of those eight groups each have only one gate body which is connected to the next gate body by a gate interconnect. These five gate bodies, 70a, 70b, 70c, 70d, and 70e form a delay path through the gate bodies and also through the interconnect 71, 72, 73 and 74. The sixth group of gate bodies is gates 70f and 70g which are connected to the fifth group of gate bodies which is composed of gate body 70e. This interconnection is through interconnect 75, which is described above and is typically disposed above a field isolation region. The seventh group of gate bodies, which is composed of gate bodies 70h and 70i is coupled to the prior group of gate bodies through interconnect 76. Finally, the eighth group of gate bodies is composed of three gate bodies 70j, 70k and 70l, which are connected to the seventh group of gate bodies by the interconnect 77. It will be appreciated that since the first five groups of gate bodies are each composed of one gate body, the input signal is delayed through the five gate bodies before reaching the remaining groups of the gate bodies in this transistor. Accordingly, the generation of considerable current is delayed longer than the embodiment shown in FIG. 3.

FIG. 4b shows an approach which tends to produce faster transition times for the output transistor at the cost of more noise relative to the transistor shown in FIG. 4a. This transistor shown in FIG. 4b includes three groups or pluralities of gate bodies. The first group of gate bodies is composed of gate bodies 90a and 90b, and the second group of gate bodies is composed of gate bodies 90c, 90d, 90e and 90f. As can be seen from FIG. 4b, the second plurality of gate bodies is coupled to the first plurality of gate bodies by the interconnect 92. Finally, the third group of gate bodies, made up of gate bodies 90g through 90l, is coupled to the second group of gate bodies by the interconnect 93. It will be appreciated that the transistor shown in FIG. 4b is faster than the transistor 4a for a number of reasons. For example, the two gate bodies 90a and 90b are in parallel and consequently present lower resistance to the input signal than the initial gate body 70a of FIG. 4a. Similarly, the second and third groups of gate bodies contain four parallel legs and six parallel legs, respectively. Also, the number of gate bodies turned on in going from one group to the next group nearly doubles each time a new group is turned on. That is, after the first two gates are turned on, four more gates are turned on in the second group of gates and finally six more gates are turned on in the third group of gates in FIG. 4b.

Figure 5:
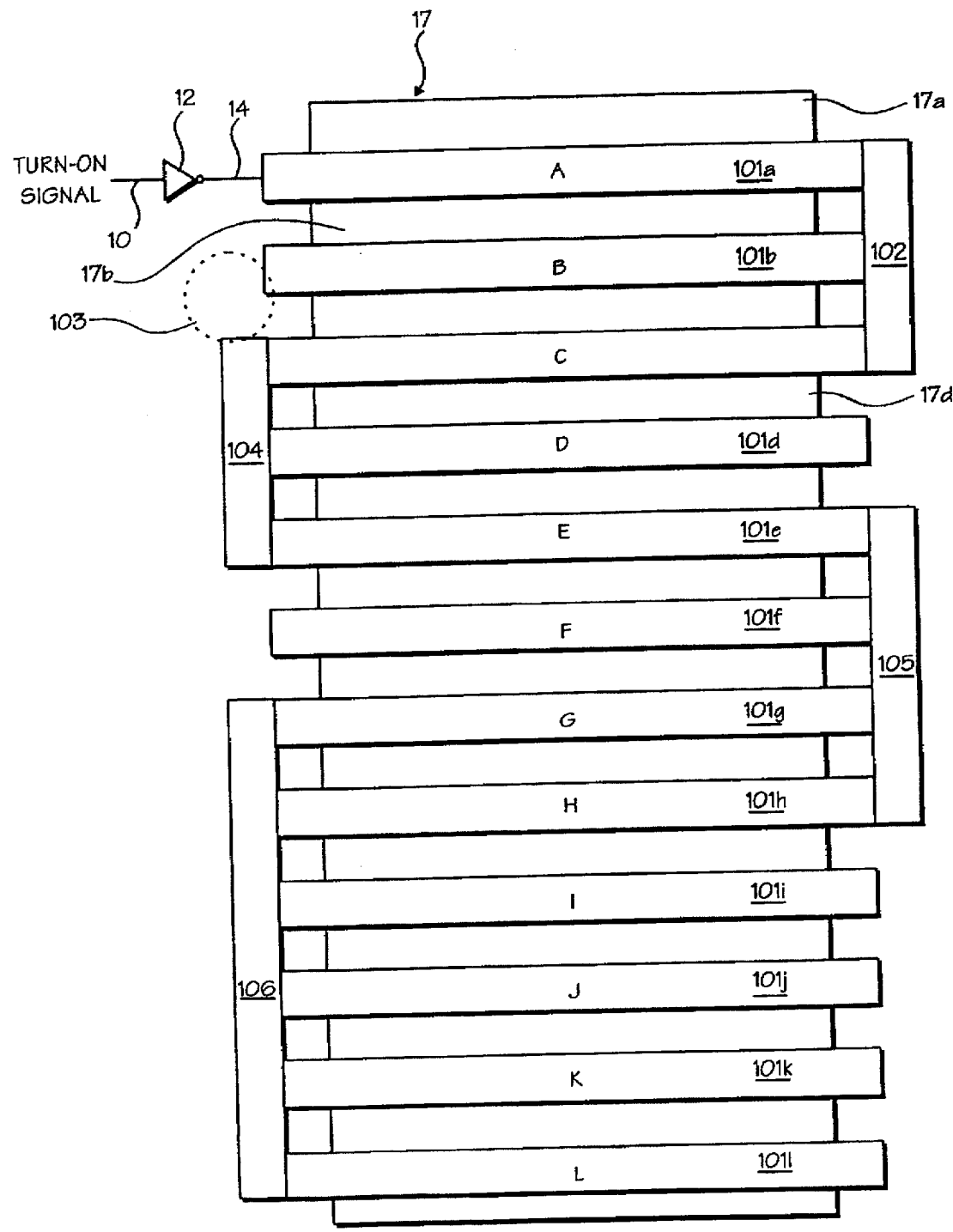
FIG. 5 shows another embodiment of an output transistor according to the present invention.

FIG. 5 shows another embodiment of the present invention. This embodiment illustrates the selective use of the interconnects such as interconnects 102, 104, 105 and 106 in order to vary the parasitic gate resistance and consequently the delay path through the gate bodies. In the embodiment shown in FIG. 5, the gate bodies are grouped in the same sequence as in the transistor shown in FIG. 3, but the parasitic gate resistors are utilized differently. Note that there is a missing portion 103 of the interconnect 104 and similarly note that gate body 101d is not coupled to the interconnect 105 and similarly 101f is not coupled to 106. This is unlike the transistor shown in FIG. 3 wherein the gate body 50b is coupled to the next gate body 50c through the interconnect 52. As noted above, the sequence of group legs in FIG. 5 is the same as sequence of group legs in FIG. 3 in that there is one gate leg in the first group and then the next two groups each have two gate legs followed by a group with three gate legs and finally a group with four gate legs. However, because of the arrangement of the interconnects as shown in FIG. 5, a different speed/noise performance is achieved. Gate legs 101b and 101c are still turned on after the delay of gate leg 101a, but now gate legs 101d and 101e are turned on through the resistance of gate leg 101c only, which gives a larger delay than the combined (parallel) resistance of gate legs 50b and 50c as with the case in FIG. 3.

Figure 2:
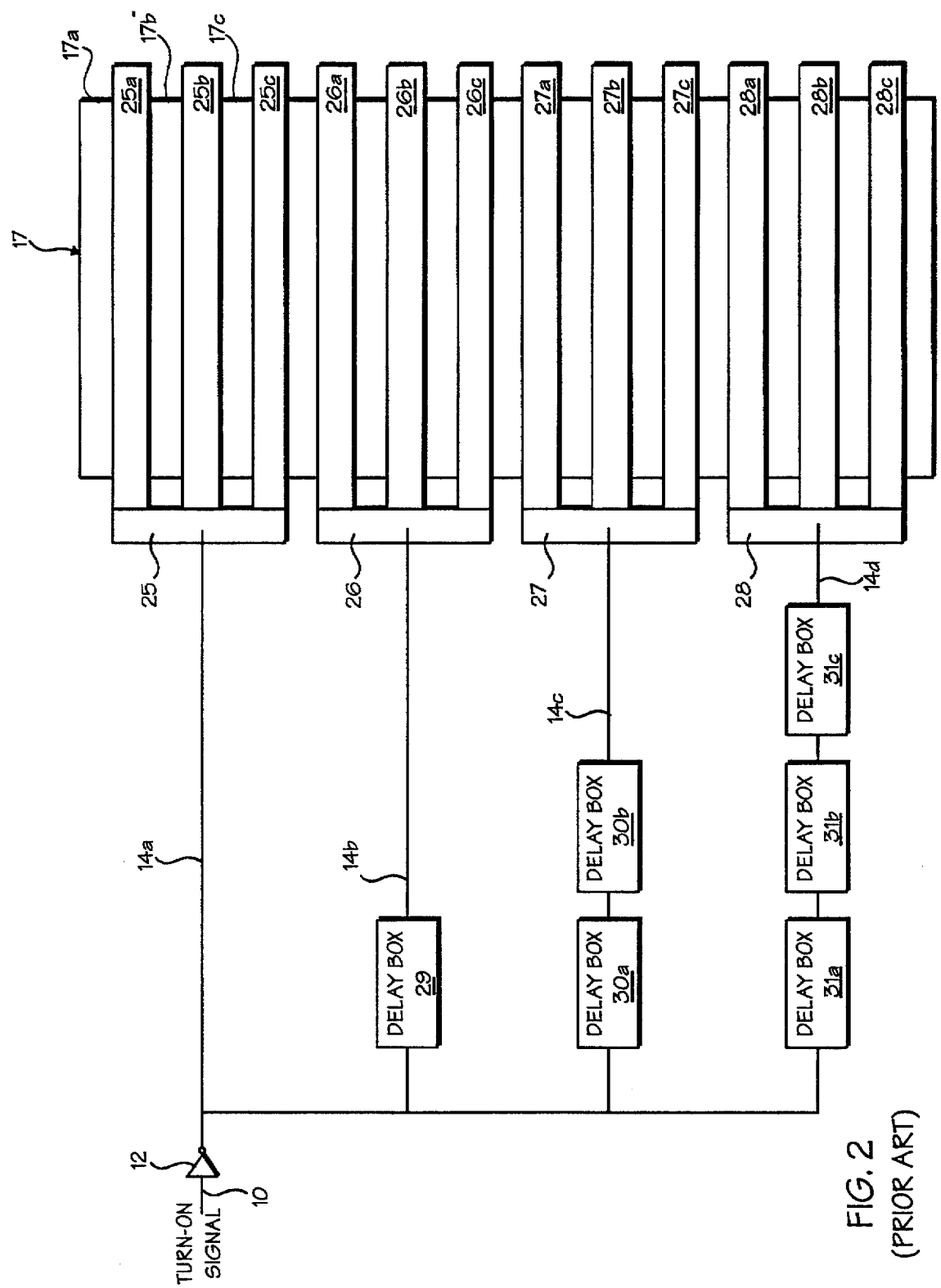
FIG. 2 shows an alternative embodiment in the prior art of an output driver transistor.

There are several advantages of the present invention over conventional noise reduction techniques such as that shown in FIG. 2. First, there is no extra semiconductor die area which is required in implementing this invention. No extra signals need to be generated and routed to the output driver device and no extra circuitry needs to exist in order to generate these extras signals. Also there is no power penalties since there are no extra signals and no delay elements. Further, the technique has the advantage of compensating for changes in the gate length and width. For instance, if a wafer fabricated in a particular lot has a smaller gate length (L effective) or a larger gate width (W effective), this results in higher currents and faster devices (including the output driver), which leads to increased noise on the chip (integrated circuit). However, the present invention will compensate for this since the smaller L effective and a larger W effective both result in increased gate resistance which will in turn slow down the turn on transition of the gate legs of the output driver and thereby reduce noise on the chip.

Likewise, an output driver device having a larger L effective or a smaller W effective (lower current and slower speed) will be compensated by a decreased gate resistance. Reduced noise means that less ringing will occur at the output of the output transistor and consequently fewer problems result from the operation of the transistor of the present invention.

The foregoing description is provided as an example of the present invention rather than providing a limited definition of the invention. Various modifications will be appreciated by those of skill in the art upon review of this specification, and these modifications will be within the spirit and scope of the present invention as defined by the following claims.

We claim:

1. A driver circuit, comprising:

one or more first gate bodies disposed over one or more first channel regions in a substrate;

a second plurality of gate bodies disposed over a second plurality of channel regions in said substrate, said second plurality of gate bodies having more gate bodies than said first gate bodies and including at least one second gate body which is coupled to at least one of said first gate bodies, said first gate bodies producing a field in said first channel regions before said second plurality of gate bodies produces a field in said second plurality of channel regions; and a third plurality of gate bodies disposed over a third plurality of channel regions in said substrate, said third plurality of gate bodies having more gate bodies than said second plurality of gate bodies and including at least one third gate body which is coupled to at least one gate body of said second plurality of gate bodies, said second plurality of gate bodies producing a field in said second plurality of channel regions before said third plurality of gate bodies produces a field in said third plurality of channel regions.

2. A driver circuit as in claim 1 wherein said first and said second gate bodies comprise polysilicon.

3. A driver circuit as in claim 2 wherein at least one of said fast gate bodies and at least one of said second gate bodies are coupled by a silicided polysilicon body.

4. A driver circuit as in claim 3 wherein said silicided polysilicon body is disposed over an isolation region on said substrate.

5. A driver circuit as in claim 4, said driver circuit being an output driver in an output driver circuit.

6. A driver circuit as in claim 2 wherein said at least one third gate body is coupled to said at least one second gate body by a silicided polysilicon body.

7. A driver circuit as in claim 6 wherein said silicided polysilicon body is disposed over an isolation region on said substrate.

8. A transistor comprising:

a first gate body coupled to an input signal, said first gate body disposed over a corresponding first channel region in a substrate, said first gate body providing a first resistance to said input signal;

a second gate body coupled to said first gate body by a silicided polysilicon body to receive said input signal from said first gate body through said first resistance, said second gate body being disposed over a corresponding second channel region in said substrate, said first gate body producing a field in said first channel region in response to said input signal before said second gate body produces a field in said second channel region.

9. A transistor as in claim 8 wherein said silicided polysilicon body is disposed over an isolation region.

10. A transistor as in claim 9, said transistor being an output driver in an output driver circuit.

11. A transistor as in claim 8 further comprising;

a third gate body coupled to said second gate body to receive said input signal from said second gate body, said third gate body being disposed over a third channel region in said substrate, said second gate body producing a field in said second channel region before said third gate body produces a field in said third channel region.

12. A method for controlling a transistor in an output driver circuit, said method comprising:

routing an input signal to a first gate body which is disposed over a first channel region in a substrate, said first gate body having a first resistance to said input signal;

delaying said input signal through said first gate body to provide a delayed input signal;

routing said delayed input signal to a second gate body which is disposed over a second channel region in said substrate, said first gate body being coupled to said second gate body through a silicided polysilicon body to provide said delayed input signal to said second gate body, wherein said first gate body produces a field in said first channel region before said second gate body produces a field in said second channel region.

13. A method as in claim 12 wherein said silicided polysilicon body is disposed over an isolation region.

* * * * *